(12) United States Patent
Eberhard

(10) Patent No.: US 12,279,466 B2
(45) Date of Patent: Apr. 15, 2025

(54) OPTOELECTRONIC SEMICONDUCTOR DEVICE COMPRISING PORTIONS OF A CONDUCTIVE LAYER AND METHOD FOR MANUFACTURING AN OPTOELECTRONIC SEMICONDUCTOR DEVICE

(71) Applicant: OSRAM Opto Semiconductors GmbH, Regensburg (DE)

(72) Inventor: Franz Eberhard, Kilchberg (CH)

(73) Assignee: OSRAM Opto Semiconductors GmbH, Regensburg (DE)

( * ) Notice: Subject to any disclaimer, the term of this patent is extended or adjusted under 35 U.S.C. 154(b) by 755 days.

(21) Appl. No.: 17/428,988

(22) PCT Filed: Feb. 7, 2020

(86) PCT No.: PCT/EP2020/053076
§ 371 (c)(1),
(2) Date: Aug. 6, 2021

(87) PCT Pub. No.: WO2020/165029
PCT Pub. Date: Aug. 20, 2020

(65) Prior Publication Data
US 2022/0077368 A1    Mar. 10, 2022

(30) Foreign Application Priority Data
Feb. 13, 2019   (DE) .................... 10 2019 103 638.0

(51) Int. Cl.
*H10H 20/857*      (2025.01)
*H10H 20/01*       (2025.01)
*H10H 20/831*      (2025.01)

(52) U.S. Cl.
CPC .......... *H10H 20/857* (2025.01); *H10H 20/01* (2025.01); *H10H 20/8316* (2025.01); *H10H 20/0364* (2025.01)

(58) Field of Classification Search
None
See application file for complete search history.

(56) References Cited

U.S. PATENT DOCUMENTS

| 2009/0212307 A1* | 8/2009 | Baur ...................... H01L 33/38 |
| | | 257/98 |
| 2011/0101390 A1 | 5/2011 | Engl et al. |

(Continued)

FOREIGN PATENT DOCUMENTS

| CN | 204289500 U | 4/2015 |
| CN | 106992235 A | 7/2017 |

(Continued)

OTHER PUBLICATIONS

Search Report by Registered Search Organization issued for the corresponding Japanese Patent Application No. 2021-547232, dated Jun. 14, 2022, 23 pages (for informational purposes only).

(Continued)

*Primary Examiner* — Steven M Page
*Assistant Examiner* — Tyler J Wiegand
(74) *Attorney, Agent, or Firm* — Viering, Jentschura & Partner mbB

(57) ABSTRACT

An optoelectronic semiconductor device may include a first and second semiconductor layer having a first and second conductivity type, respectively, a first contact structure, a contact layer, and a separating layer. Contact holes are arranged in the separating layer. The optoelectronic semiconductor device may include portions of a conductive layer arranged over a side of the separating layer facing away from the contact layer. The portions of the conductive layer are each connected to a conducting material in the contact holes. The first contact structure is connected to the contact layer via the portions of the conductive layer and the conducting material. A length of each of the portions is greater than a greatest width of the portions. The length (Continued)

denotes a shortest distance between an associated contact hole and a conductive material between adjacent portions, and the width is measured perpendicular to the length.

17 Claims, 8 Drawing Sheets

(56) References Cited

U.S. PATENT DOCUMENTS

| | | |
|---|---|---|
| 2011/0114988 A1 | 5/2011 | Sabathil et al. |
| 2011/0284893 A1 | 11/2011 | Hoeppel et al. |
| 2012/0049756 A1 | 3/2012 | Schubert |
| 2012/0086026 A1* | 4/2012 | Engl .................. H01L 27/156 |
| | | 438/34 |
| 2012/0132948 A1 | 5/2012 | Nunotani et al. |
| 2012/0261641 A1 | 10/2012 | Tanaka |
| 2013/0020552 A1 | 1/2013 | Kazama |
| 2015/0236215 A1 | 8/2015 | Jeon et al. |
| 2015/0349220 A1 | 12/2015 | Moon et al. |
| 2016/0087157 A1 | 3/2016 | Hsu et al. |
| 2016/0260869 A1* | 9/2016 | Jeon .................. H01L 33/38 |
| 2018/0315891 A1 | 11/2018 | Hahn et al. |
| 2019/0326471 A1 | 10/2019 | Eberhard et al. |

FOREIGN PATENT DOCUMENTS

| | | |
|---|---|---|
| DE | 102008011848 A1 | 9/2009 |
| DE | 102015118234 A1 | 4/2017 |
| DE | 102016112587 A1 | 1/2018 |
| EP | 2562813 A2 | 2/2013 |
| JP | 2004071655 A | 3/2004 |
| JP | 2009246311 A | 10/2009 |
| JP | 2011513957 A | 4/2011 |
| JP | 2011529277 A | 12/2011 |
| JP | 2012028383 A | 2/2012 |
| JP | 2012114329 A | 6/2012 |
| JP | 2012156272 A | 8/2012 |
| JP | 2012227289 A | 11/2012 |
| JP | 2013026451 A | 2/2013 |
| JP | 2013048199 A | 3/2013 |
| JP | 2013055186 A | 3/2013 |
| JP | 2014116397 A | 6/2014 |
| JP | 2015228497 A | 12/2015 |
| KR | 20120084562 A | 7/2012 |
| KR | 20130111792 A | 10/2013 |
| KR | 20150114112 A | 10/2015 |

OTHER PUBLICATIONS

International search report issued for the corresponding international patent application No. PCT/EP2020/053076, dated Apr. 21, 2020, 5 pages (for informational purposes only).

German Search Report issued for the corresponding German patent application No. 10 2019 103 638.0, dated Oct. 29, 2019, 6 pages (for informational purposes only).

Chinese office action issued for the corresponding Chinese patent application No. 202080013993.X, dated Jul. 10, 2024, 8 pages (for informational purposes only).

Chinese office action issued for the corresponding Chinese patent application No. 202080013993.X, dated Nov. 27, 2024, 4 pages (for informational purposes only).

* cited by examiner

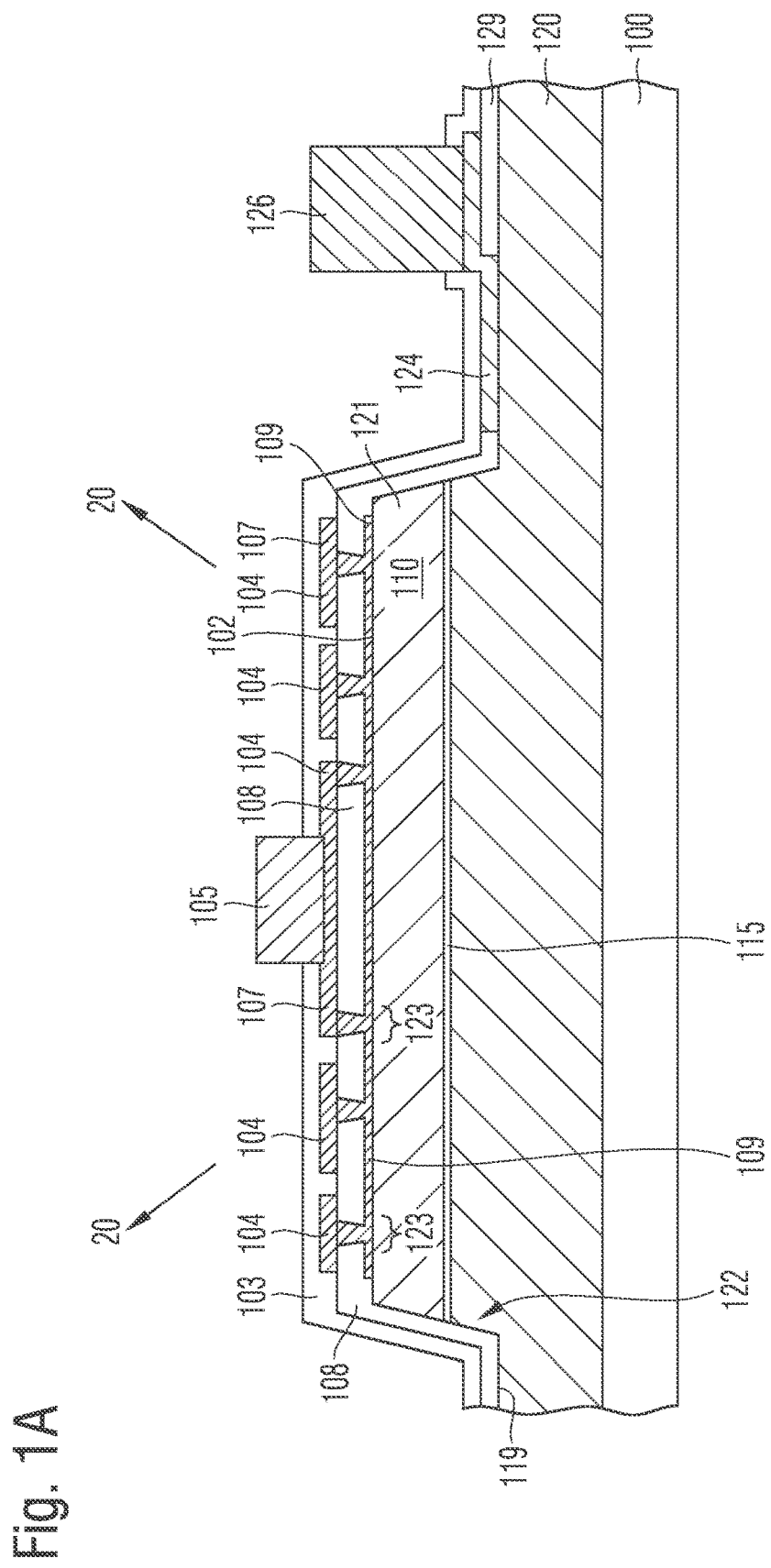

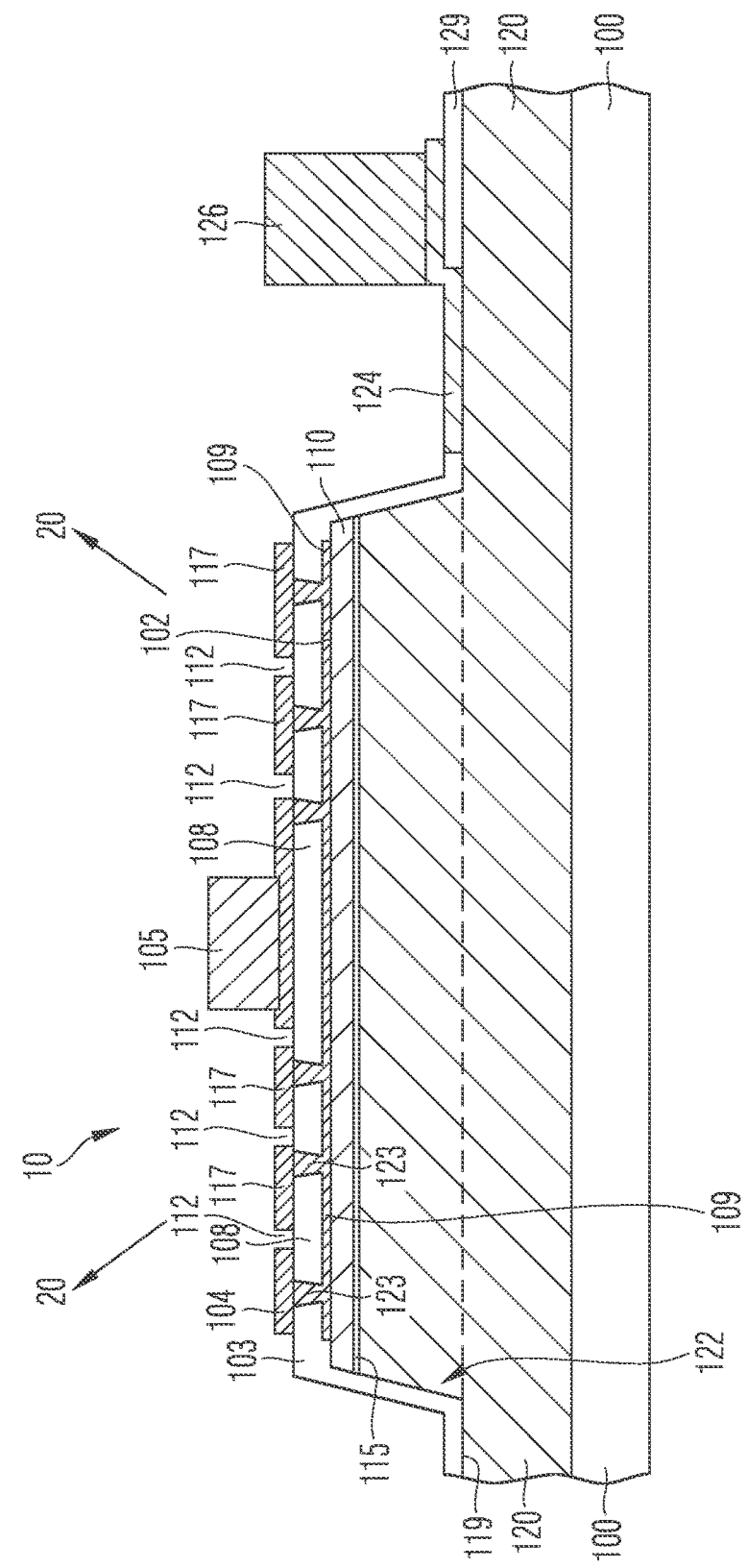

OPTOELECTRONIC SEMICONDUCTOR DEVICE COMPRISING PORTIONS OF A CONDUCTIVE LAYER AND METHOD FOR MANUFACTURING AN OPTOELECTRONIC SEMICONDUCTOR DEVICE

CROSS-REFERENCE TO RELATED APPLICATIONS

The present application is a national stage entry according to 35 U.S.C. § 371 of PCT Application No. PCT/EP2020/053076 filed on Feb. 7, 2020; which claims priority to German Patent Application Serial No. 10 2019 103 638.0 filed on Feb. 13, 2019; all of which are incorporated herein by reference in their entirety and for all purposes.

TECHNICAL FIELD

The present invention relates to optoelectronic semiconductor devices having portions of a conductive layer arranged over a side of a separating layer facing away from a contact layer.

BACKGROUND

This patent application claims the priority of German patent application DE 10 2019 103 638.0, the disclosure contents of which are incorporated herein by reference.

A light emitting diode (LED) is a light emitting device based on semiconductor materials. For example, an LED includes a pn junction. When electrons and holes recombine with one another in the regions of the pn junction, due, for example, to a corresponding voltage being applied, electromagnetic radiation is generated.

In general, concepts are being researched by means of which a current supply to the semiconductor layers may be improved.

An objective is to provide an improved optoelectronic semiconductor device and an improved method for manufacturing an optoelectronic semiconductor device.

The objective is achieved by the subject matter and the method of the independent claims, Advantageous enhancements are defined in the dependent claims.

SUMMARY

An optoelectronic semiconductor device comprises a first semiconductor layer of a first conductivity type and a second semiconductor layer of a second conductivity type, the first and the second semiconductor layers being stacked on top of the other. The optoelectronic semiconductor device further comprises a first contact structure, a contact layer which is arranged over a side of the first semiconductor layer facing away from the second semiconductor layer and is connected to the first semiconductor layer, a separating layer which is arranged over a side of the contact layer facing away from the first semiconductor layer, and contact holes arranged in the separating layer. The optoelectronic semiconductor device furthermore comprises portions of a conductive layer which are arranged over a side of the separating layer facing away from the contact layer. The portions of the conductive layer are each connected to a conductive material in the contact holes.

The first contact structure is connected to the contact layer via the portions of the conductive layer and the conductive material in the contact holes. A length of each of the portions is greater than a greatest width of the portions, the length denoting a shortest distance between an associated contact hole and a conductive material between adjacent portions and the width being measured perpendicular to the length in the horizontal direction. The conductive material may be part of the first contact structure or part of the conductive layer, for example. At least two portions connecting contact holes which have different distances from the first contact structure with the first contact structure have mutually different widths.

According to embodiments, the majority of the portions of the conductive layer is electrically connected to exactly one respective contact hole. For example, a width of one of the portions of the conductive layer is selected in each case as a function of a distance between the associated contact hole and the first contact structure. As used in the present disclosure, the term "majority" means that more than 50%, for example more than 758 or even more than 90% of the portions of the conductive layer are electrically connected to exactly one respective contact hole.

The optoelectronic semiconductor device may also comprise parts of an optical levelling or compensation layer between adjacent portions of the conductive layer. For example, a material of the optical levelling layer is selected from SiON, $Y_2O_3$, $SC_2O_3$, $HfO_2$, $Zro_2$, $Ta_2O_5$, $TiO_2$ or $Nb_2O_5$.

According to further embodiments, an optoelectronic semiconductor device comprises a first semiconductor layer of a first conductivity type and a second semiconductor layer of a second conductivity type, the first and second semiconductor layers being stacked one on top of the other. The optoelectronic semiconductor device further comprises a first contact structure, a contact layer which is arranged over a side of the first semiconductor layer facing away from the second semiconductor layer and is connected to the first semiconductor layer, and a separating layer which is arranged over a side of the contact layer facing away from the first semiconductor layer. The optoelectronic semiconductor device also comprises an electrically conductive layer which is arranged over a side of the separating layer facing away from the contact layer, wherein slots are formed in the conductive layer and the electrically conductive layer is electrically connected to the first contact structure, and contact holes which are arranged in the separating layer. In this case, the conductive layer is connected to the contact layer via a conducting material in the contact holes.

For example, the slots may each be arranged between a contact hole and the first contact structure and intersect a shortest current path between the first contact structure and the contact hole. The slots may extend perpendicular to the first contact structure. For example, the slots intersect or touch the first contact structure.

A method for manufacturing an optoelectronic semiconductor device comprises forming a semiconductor layer stack comprising a first semiconductor layer of a first conductivity type and a second semiconductor layer of a second conductivity type, forming a contact layer after forming the first semiconductor layer, the contact layer being connected to the first semiconductor layer, and forming a separating layer after forming the contact layer. The method further comprises forming contact holes in the separating layer and forming portions of an electrically conductive layer after forming the separating layer. The portions of the conductive layer are each connected to a conductive material in the contact holes. Furthermore, a first contact structure is connected to the contact layer via the portions of the conductive layer and the conductive material in the contact holes. A length of each of the portions is greater than a greatest width of the portions, the length denoting a shortest distance between an associated contact hole and a conductive material between adjacent portions and the width being measured perpendicular to the length in the horizontal direction. The conductive material may be part of the first contact structure, for example. According to further embodiments, the conductive material may also be part of the conductive layer. At least two portions connecting contact holes which have different distances from the first contact structure to the first contact structure have mutually different widths.

For example, for a majority of the contact holes, a lead resistance of an associated portion of the conductive layer may be adjusted as a function of a distance from the contact hole to the first contact structure. According to embodiments, a horizontal width of the portions of the conductive layer is adjusted.

For example, forming the portions of the conductive layer may comprise forming and subsequently patterning the conductive layer. The method may furthermore comprise introducing a levelling layer between the portions of the conductive layer.

The conductive layer may be patterned by etching using a mask. The method may further include introducing a levelling layer between regions of the mask after the etching.

The method may further include defining slots in the conductive layer. For example, the slots may be defined between contact holes and the first contact structure.

BRIEF DESCRIPTION OF THE DRAWINGS

The accompanying drawings serve to provide an understanding of various embodiments. The drawings illustrate various embodiments and, together with the description, serve for explanation thereof. Further embodiments and many of the intended advantages will become apparent directly from the following detailed description. The elements and structures shown in the drawings are not necessarily shown to scale relative to each other. Like reference numerals refer to like or corresponding elements and structures.

FIG. 1A shows a schematic cross-sectional view of an optoelectronic semiconductor device according to embodiments.

FIG. 4A shows a schematic cross-sectional view of an optoelectronic semiconductor device according to further embodiments.

DETAILED DESCRIPTION

Figure 1B:
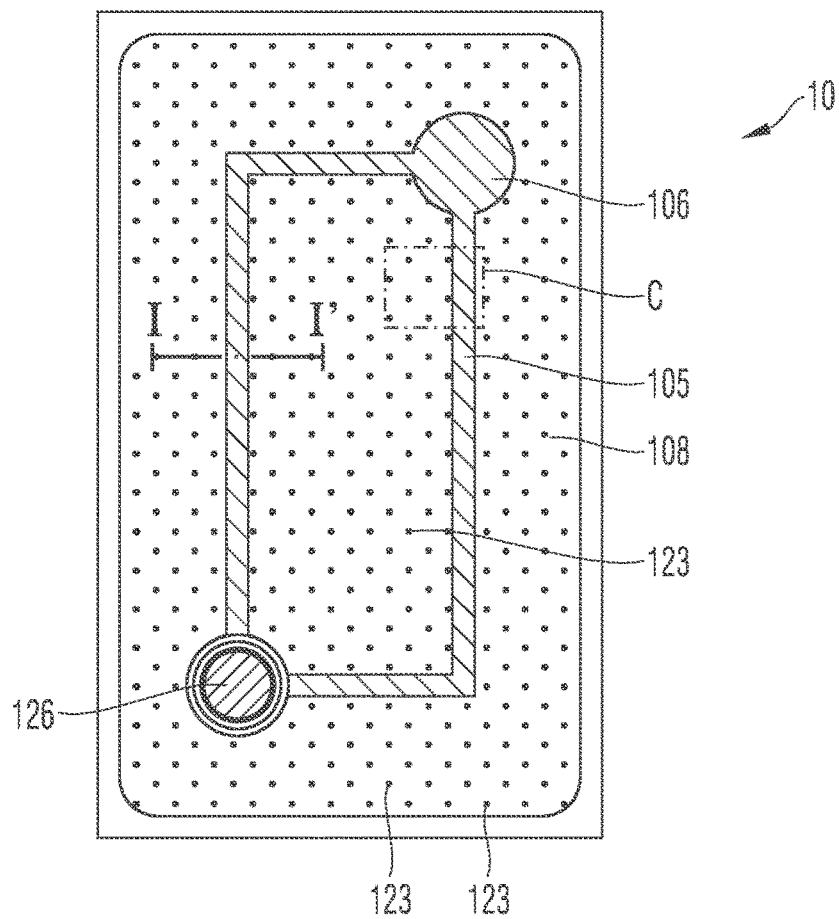
FIG. 1B shows a schematic layout of an optoelectronic semiconductor device according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the FIG.s just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface, Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz or a ceramic.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the ternary compounds may vary, Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1A shows a vertical cross-sectional view of an optoelectronic semiconductor device according to embodiments. The optoelectronic semiconductor device 10 shown in FIG. 1A may, for example, be a light emitting diode (LED). A first semiconductor layer 110 and a second semiconductor layer 120 are arranged over a suitable carrier 100. For example, the first semiconductor layer 110 may be doped with a first conductivity type, for example p-type, and the second semiconductor layer 120 may be of a second conductivity type, for example n-type. For example, the first and the second semiconductor layer 110, 120 are based on a nitride compound semiconductor material. An active zone 115 may be arranged between the first semiconductor layer 110 and the second semiconductor layer 120.

The active zone may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these layers.

For example, the second semiconductor layer 120 may be arranged between the first semiconductor layer 110 and a suitable carrier 100. For example, the carrier 100 may be a growth substrate for the semiconductor layer sequence. Suitable materials for the growth substrate may include, for example, sapphire, silicon carbide or gallium nitride. A contact layer 109 made of an electrically conductive material may be arranged over the first semiconductor layer 110. For example, the contact layer 109 may be composed of a conductive oxide, a so-called "TCO" ("transparent conductive oxide"). Examples include, without limitation, ITO (indium tin oxide), IZO (indium zinc oxide), or another transparent conductive material. The contact layer 109 may, for example, be directly adjacent to the first semiconductor layer 110.

A separating layer 108 may be disposed over the contact layer 109. For example, the separating layer 108 may comprise one or more insulating layers. Contact holes 123 may be formed in the separating layer 108. Portions 104 of a conductive layer 107 are arranged above the separating layer 108. A conductive material may be arranged in the contact holes 123. For example, the conductive material in the contact holes 123 may be part of the conductive layer 107. According to further embodiments, however, an electrically conductive contact material may be arranged in the contact holes 123.

Furthermore, the optoelectronic semiconductor device shown in FIG. 1A comprises a first contact structure 105 which is connected to the contact layer 109 via the portions 104 of the conductive layer 107 and the conductive material in the contact holes 123. The conductive layer 107 is composed of a transparent conductive material, for example a conductive metal oxide such as ITO or IZO, For example, a layer thickness of the conductive layer 107 may be greater than a layer thickness of the contact layer 109. For example, the layer thickness of the contact layer may be 5 to 25 nm. The layer thickness of the conductive layer may, for example, be 50 to 150 nm. In the optoelectronic semiconductor device shown in FIG. 1A, the functions of current spreading and electrical contact are separated from one another. More precisely, a thin contact layer 109 is arranged in contact with the first semiconductor layer 110 over the entire or a large area. Due to its thinner layer thickness, the thin contact layer 109 has reduced transverse conductivity. Conversely, less electromagnetic radiation is absorbed due to the reduced layer thickness. The thicker conductive layer effects improved transverse conductivity. Radiation losses may be reduced, for example, via the separating layer 108, as will be explained below. Electrical contact between the first contact structure 105 and the contact layer 109 is effected via the portions 104 of the conductive layer 107 through the electrically conductive material in the contact holes 123 within the separating layer 108.

The separating layer 108 includes a dielectric material, for example silicon nitride, silicon oxide, silicon oxynitride, aluminum oxide, titanium oxide, tantalum oxide, niobium oxide, and combinations of these materials. According to embodiments, the separating layer 108 may be composed of a single dielectric material. For example, the separating layer may have an adapted refractive index, wherein "adapted" means that the refractive index of the dielectric material is greater than or equal to the refractive index of a medium surrounding the separating layer 108. The surrounding medium is arranged behind the separating layer 108 in the exit direction of the emitted electromagnetic radiation. The surrounding medium comprises elements which enclose the semiconductor body and in particular have a protective function. For example, the semiconductor body may have a passivation layer and/or encapsulation as the surrounding medium.

In an alternative configuration, the separating layer 108 has a multilayer design and comprises at least two sub-layers which differ from one another in terms of their refractive index. The separating layer 108 comprises a layer sequence consisting of alternating sub-layers with a higher refractive index and a lower refractive index. In particular, the sub-layers with a higher refractive index have a smaller thickness than the sub-layers with a lower refractive index.

For example, the separating layer 108 has a thickness in a range of 400 nm to 800 nm. At a thickness in the range of 400 nm to 800 nm, a suitable compromise between manufacturing cost and a filter characteristic of the separating layer 108 may be achieved.

According to configurations, the separating layer 108 may be configured such that, for example, only radiation incident on the separating layer 108 at steep angles reaches the conductive layer 107. In contrast, flat radiation components which cannot be coupled out due to the difference in refractive index between the semiconductor layers and the surrounding medium due to total reflections at the transition between the optically denser and the optically thinner medium, may be retained by the separating layer 108. As a result, absorption losses in the thicker conductive layer 107 are essentially limited to the angular range that enables spreading. For example, the separating layer 108 comprises filter characteristics which causes radiation incident on the separating layer at an angle within a first angular range, that is to say, at steep angles, to be predominantly transmitted. Furthermore, radiation incident on the separating layer 108 at an angle within a second angular range, that is to say, at flat angles, is predominantly reflected.

For example, the boundary between the first angular range and the second angular range is determined by the critical angle of total reflection, which may be derived from the refractive index of the semiconductor layers and the refractive index of the surrounding medium. The first angular range comprises angles that are smaller than this threshold. The second angular range, however, includes angles that are greater than this threshold.

For example, the separating layer 108 may include a layer stack which comprises a first niobium oxide layer, a silicon oxide layer, and a second niobium oxide layer.

For example, the semiconductor layer stack may be patterned to form a mesa 121. Accordingly, a part of a first main surface 119 of the second semiconductor layer 120 may be exposed. For example, a part of the separating layer 108 may be arranged adjacent to the first main surface 119 of the second semiconductor layer 120. Furthermore, a part of the separating layer 108 may be arranged over a side wall 122 of the mesa 121. A second electrical contact element 126 may, for example, contact the second semiconductor layer 120 in the region of an exposed first main surface 119. For example, the second contact element 126 may be connected to the second semiconductor layer 120 via a conductive material 124. An insulating material 129 may be arranged between the second contact element 126 and the underlying semiconductor material 120. For example, the structure arranged on the left side of the second contact element 126 may be repeated on the right side of the second contact element 126.

By applying a voltage between the first contact structure 105 and the second contact element 126, a current may be impressed into the optoelectronic semiconductor device so that electromagnetic radiation 20 may be emitted, for example, via a first main surface of the first semiconductor layer 102. In general, the more uniform the current injection, the greater the efficiency of the optoelectronic semiconductor device.

FIG. 1B shows a schematic layout of an optoelectronic semiconductor device according to embodiments. In this case, for example, the first contact structure 105 is formed as a contact finger. The contact finger may be rectangular, ring-shaped or arc-shaped. However, any other configuration of this contact finger is possible. For example, it may be formed in the shape of a comb or similar to the veining of a leaf. Furthermore, the first contact structure 105 may comprise a plurality of contact fingers, which may be identical to or different from one another. The first contact structure 105 is electrically connectable via a first contact element 106. Furthermore, the optoelectronic semiconductor device 10 comprises a second contact element 126.

According to the embodiments shown in FIG. 1B, for example, a first contact structure 105 for electrically contacting the first semiconductor layer 110 and a second contact structure (not shown in FIG. 1B) may be formed one above the other in the vertical direction. This will be explained in more detail with reference to FIG. 1D. The optoelectronic semiconductor device 10 shown in FIG. 1B moreover comprises a multiplicity of contact holes 123 in the separating layer 108. The second contact element 126 may be arranged diagonally across from the first contact element 106, for example at a corner position of the rectangle. For example, the second semiconductor layer may be contacted at a location that is surrounded on both sides by the first semiconductor layer 110.

Figure 1C:
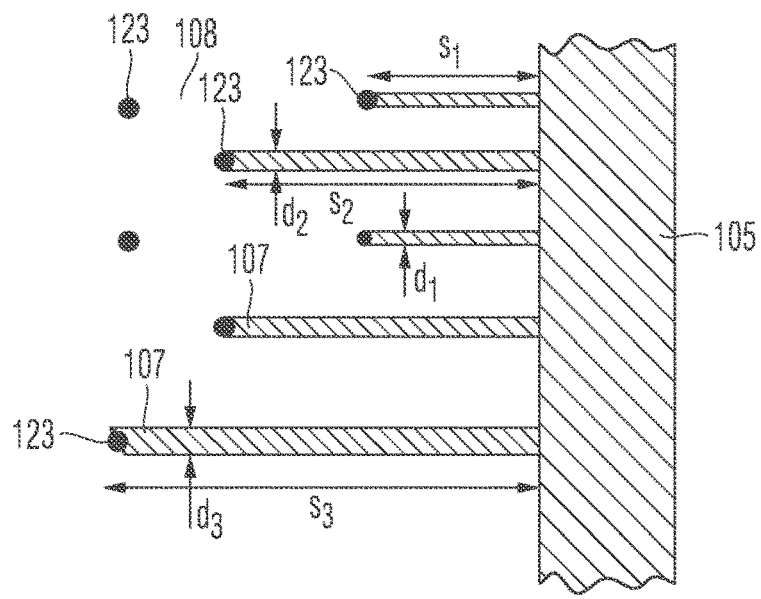
FIG. 1C shows an enlarged view of a part of the components of FIG. 1B.

FIG. 1C shows an enlarged view of the detail designated "C" in FIG. 1B. FIG. 1C shows the first contact structure 105 and a plurality of portions 104 of the conductive material. The portions 104 of the conductive material may be connected to one another, for example, via a material of the conductive layer 107 which is arranged beneath the first contact structure 105. The portions 104 of the conductive material may furthermore be connected via a part of the conductive layer 107 which does not necessarily have to be arranged beneath the first contact structure 105. A length s of each of the portions 104 is greater than a greatest width d of the portions 104. The length s denotes a shortest portion between an associated contact hole 123 and a conductive material between adjacent portions 104. The conductive material may be part of the first contact structure 105 or part of the conductive layer 107, for example. The width d is measured perpendicular to the length s. For example, the length s may be at least twice or at least three times or even at least four times the width d of the portions 104. For example, the length s of a section 104 may be defined as the longitudinal expansion range of the conductive material 107, in which adjacent portions 104 are not directly adjacent to one another but are spaced apart, for example, by a gap or another material, for example insulating material.

The term "portion of the conductive material", in this context, refers to a patterned part of the conductive material. Adjacent portions may be electrically and physically connected to one another, for example via the conductive material or also via the first contact structure 105. The portions may, for example, at least partially have a rectangular area.

For example, exactly one contact hole 123 may be assigned and connected to each portion 104 of the conductive layer 107. According to further embodiments, to a majority, for example more than 50% or more than 75% or even more than 90%, of each of the portions 104 of the conductive layer 107, exactly one contact hole 123 may be assigned and connected. An electrical contact between the contact layer (109, not shown in FIG. 1C) and the portion 104 may occur via this contact hole 123 only. For example, a width d of each portion 104 of the conductive layer 107 may be selected as a function of a length s of the portion 104. For example, a portion 104 of a small length s1 and a smallest width d1 may be assigned to each contact hole 123 having the smallest distance. In a corresponding manner, a portion 104 of the greatest length s3 and the greatest width d3 may be assigned to each of the contact holes 123 having the greatest distance from the first contact structure 105. The greater the distance from the first contact structure 105, the wider the associated portion 104 is formed. The smaller the distance from the first contact structure 105, the narrower the associated portion 104 is formed. For example, if the portions 104 are of different lengths, they may each have a different width. In this manner, the lead resistance or supply line resistance may be adjusted to approximately the same values via the associated portion 104 of the conductive layer 107. As a result, a particularly homogeneous current spreading may be achieved.

According to further embodiments, the respective widths of the portions 104 may be dimensioned according to other criteria. For example, a current injection may occur into regions of high outcoupling probability. As the individual portions 104 are separated from one another in places, improved ESD ("electrostatic discharge") stability of the optoelectronic semiconductor device may be achieved, thereby reducing the risk of failure. Furthermore, due to the specific configuration of the portions 104, in which portions 104 having a shorter distance to the associated contact hole 123 have a disproportionately reduced width, the lead resistance to contact holes 123 which are located in the vicinity of the first contact structure 105 is increased compared to the lead resistance at respectively proportionally adjusted widths d. As a result, the current density in the vicinity of the first contact structure 105 is reduced. As shown in FIG. 1C, the portions 104 of the conductive layer 107 extend approximately perpendicular to the first contact structure 105 or approximately parallel to current flow lines.

Figure 1D:
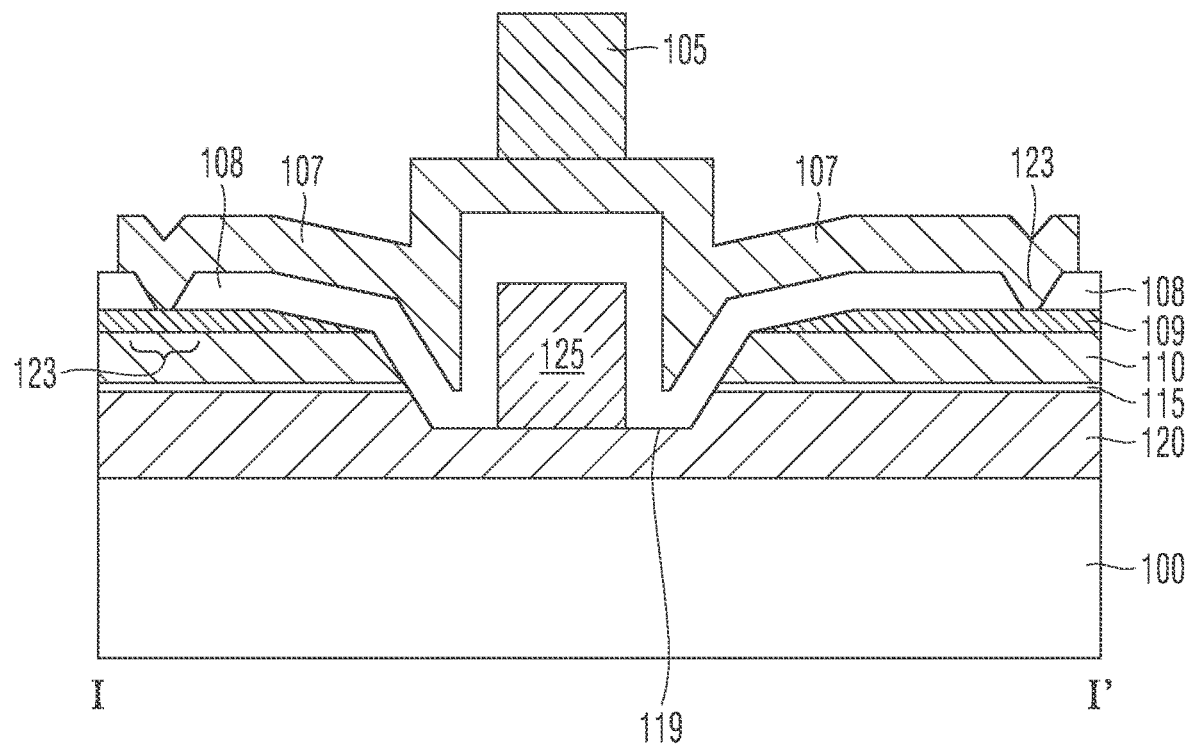
FIG. 1D shows a schematic vertical cross-sectional view of parts of the optoelectronic semiconductor device shown in FIG. 1B.

FIG. 1D shows a schematic cross-sectional view of the optoelectronic semiconductor device between I and I', as indicated in FIG. 1B. The second semiconductor layer 120 and the first semiconductor layer 110 and, if applicable, the active zone 115 are arranged over the carrier 100. Parts of the first semiconductor layer 110 and the active zone 115 are removed in places, so that a part of the first surface 119 of the second semiconductor layer 120 is exposed. A second contact structure 125 is arranged in this area. Parts of the first and second semiconductor layers 110, 120 are respectively arranged on both sides of the second contact structure 125. The second contact structure 125 is enclosed on three sides by the separating layer 108, for example, so that the second contact structure 125 is electrically insulated from the adjacent portions 104 of the conductive material 107. For example, the second contact structure 125 includes a layer stack that includes one or more metallic layers, or a layer stack that may include a conductive oxide layer (TCO, "transparent conductive oxide"). The layer stack may, for example, contain an Ag layer, which may be decisive for the electrical function of the contact structure 125. The first contact structure 105 may be arranged over the second contact structure 125 in the vertical direction. In this manner, absorption of the electromagnetic radiation generated may be reduced. Furthermore, the second semiconductor layer 120 may be contacted via the second contact structure 125 in a space-saving manner. The first semiconductor layer 110 is electrically connected to the portions 104 of the electrically conductive layer 107 and to the first contact structure 105 via the contact layer 109 and via the electrically conductive material in the contact holes 123.

Figure 2A:
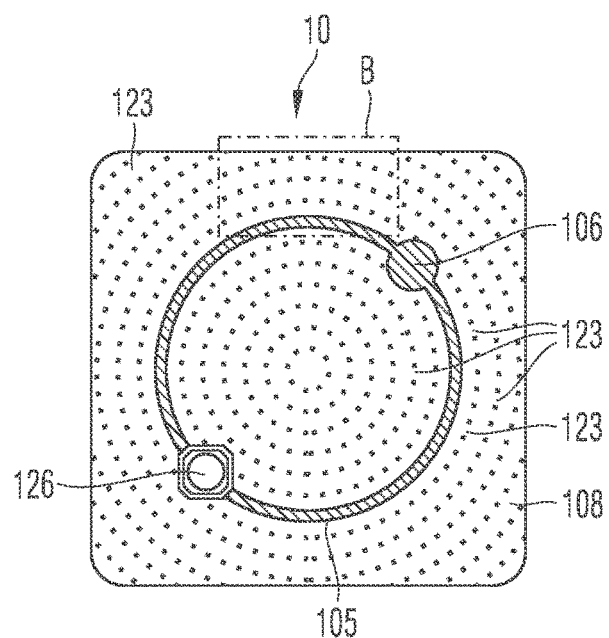
FIG. 2A shows a schematic layout of an optoelectronic semiconductor device according to further embodiments.

FIG. 2A shows a schematic layout of an optoelectronic semiconductor device 10 according to further embodiments. Unlike in the embodiment shown in FIG. 1B, the first contact structure 105 is configured to be arcuate. For example, part of the first contact structure 105 is formed as a first contact element 106. The second contact element 126 is insulated from the first contact structure 105 and connected to a second contact structure 125, not shown. The second contact structure is arranged in a plane beneath the drawing plane shown. A plurality of contact holes 123 is arranged, for example, along concentric circles inside and outside the circle or the region which is defined by the first contact structure 105. Of course, an alternative arrangement pattern of the contact holes 123 may also be implemented.

Figure 2B:
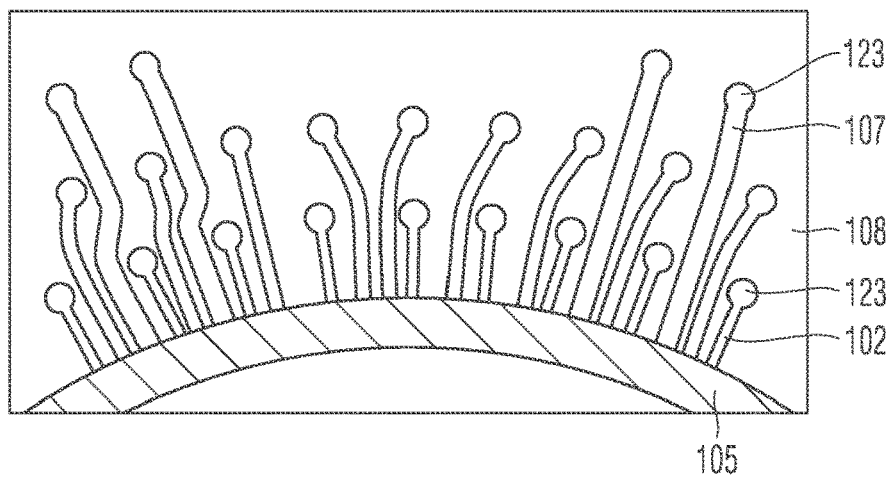
FIG. 2B shows an enlarged view of a section of the structure shown in FIG. 2A.

FIG. 2B shows an enlarged view of region B, which is identified in FIG. 2A. As shown in FIG. 2B, the individual contact holes 123 are each connected separately to the first contact structure 105 by portions 104 of a conductive layer 107. The portions 104 of the conductive layer 107 may each be connected to one another via the contact structure 105. A width of the portions 104 is selected depending on the distance between the associated contact holes 123 and the contact structure 105. The distance between the contact hole 123 and the first contact structure 105 or electrically conductive material between adjacent portions is in each case measured perpendicular to the course of the first contact structure 105 or along a direction of current flow. The width of each of the portions 104 is measured perpendicular to a direction in which the portions 104 extend. In the embodiment shown in FIG. 2B, too, the width of the portions 104 is the greater the greater the distance between the associated contact holes 123 and the first contact structure 105. In this manner, the resistance between the first contact structure 105 and the first semiconductor layer 110 may be kept approximately constant. Here, too, portions 104 which have different lengths from one another have different widths from one another.

According to embodiments, for example, portions 104 of the conductive layer 107 may be produced by patterning the conductive layer 107. In this process, parts of the conductive layer are removed. The local removal of parts of the conductive layer 107 may compromise the optical behavior of the optoelectronic semiconductor device, in particular transmission. In order to compensate for these effects, an optical compensating layer 118 may be provided in addition.

Figure 3:
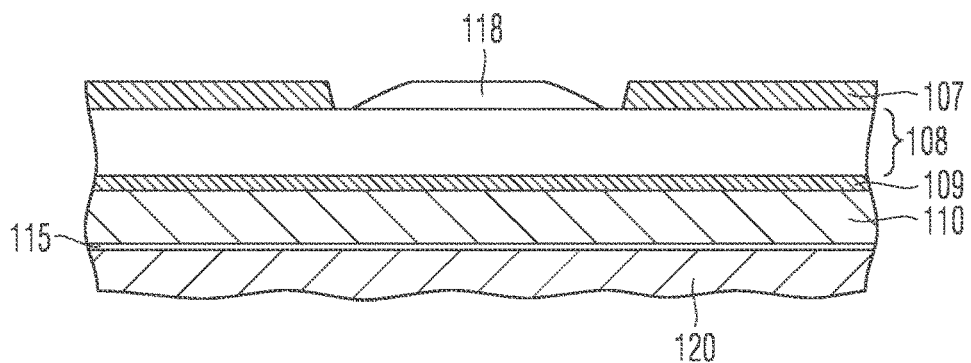
FIG. 3 shows a vertical cross-sectional view of a part of an optoelectronic semiconductor device.

FIG. 3 shows a cross-sectional view of part of an optoelectronic semiconductor device comprising a levelling layer 118 which is arranged between adjacent portions 104 of the conductive layer 107, For example, the levelling layer may be as absorption-free as possible. For example, a material may be selected which has a refractive index similar to that of the conductive layer 107 that has been etched away, for example SiON, $Y_2O_3$, $SC_2O_3$, $HfO_2$, $ZrO_2$, $Ta_2O_5$, $Nb_2O_5$ or $TiO_2$, By adjusting the layer thickness, deviations in the refractive index may be partially compensated. According to embodiments, the levelling layer may also include a layer stack comprising several individual layers of these materials. By depositing an $Nb_2O_5$ layer with a suitable layer thickness, it is possible to change the optical properties, for example transmission, of the optoelectronic semiconductor device as little as possible when removing regions of the conductive layer 107. In this manner, the coupling-out efficiency of the optoelectronic semiconductor device may be further improved.

FIG. 4A shows a vertical cross-sectional view of an optoelectronic semiconductor device according to further embodiments. The optoelectronic semiconductor device comprises a first semiconductor layer 110 of a first conductivity type and a second semiconductor layer 120 of a second conductivity type, as has been described with reference to FIG. 1A. Furthermore, the optoelectronic semiconductor device comprises a contact layer 109, a separating layer 108, and an electrically conductive layer 117. The contact layer 109, the separating layer, and the electrically conductive layer 117 are, for example, configured as described with reference to FIG. 1A. Slots 112 are formed in the conductive layer 117. The optoelectronic semiconductor device 10 further comprises contact holes 123, and the conductive layer 117 is connected to the contact layer 109 via a conductive material in the contact holes 123.

Further components of the optoelectronic semiconductor device are similar to those described with reference to FIGS.

1A to 1D. In contrast thereto, the electrically conductive layer 117 is formed as a layer, with slots being formed in the conductive layer.

Figure 4B:
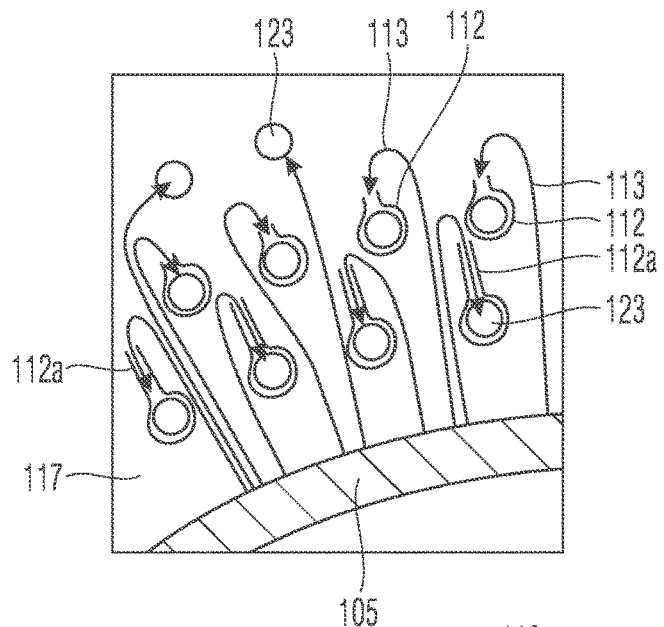
FIG. 4B shows an enlarged view of a part of an optoelectronic semiconductor device according to embodiments.

FIG. 4B shows an enlarged detail of a part of an optoelectronic semiconductor device according to embodiments. The portion shown in FIG. 4B is marked "A" in FIG. 4D, for example.

Figure 4C:
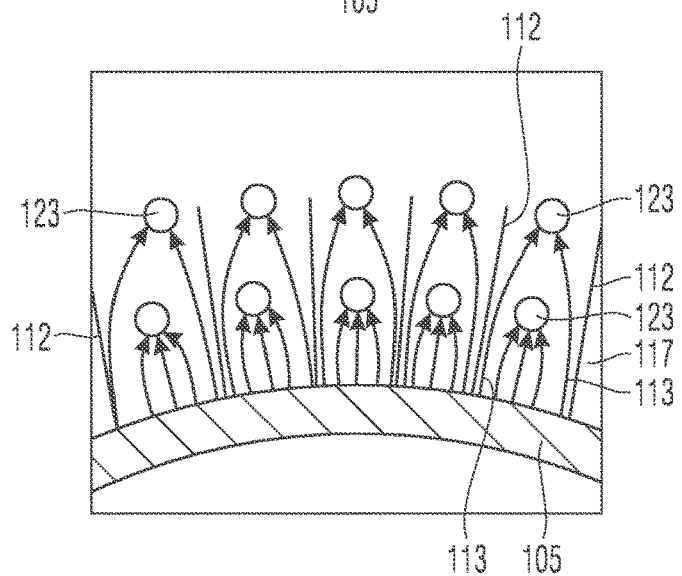
FIG. 4C shows an enlarged view of a part of an optoelectronic semiconductor device according to further embodiments.
Figure 4D:
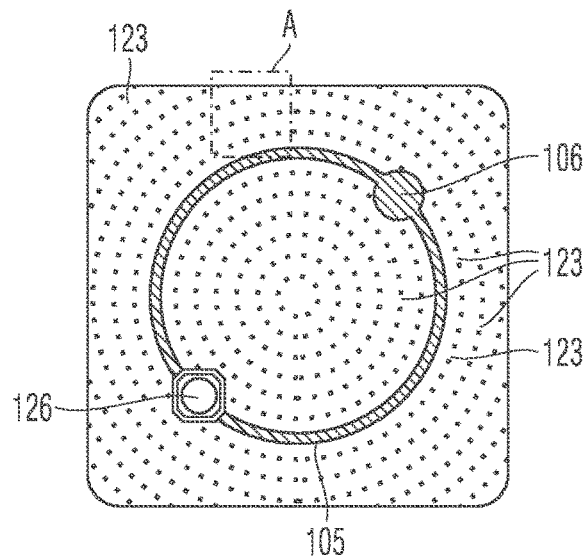
FIG. 4D shows a schematic layout of a part of an optoelectronic semiconductor device.

According to embodiments, the slots 112, as shown in FIG. 4B, may be arranged between contact holes 123 and the first contact structure 105. For example, they may each enclose the contact hole 123 on a side facing the first contact structure 105 to such an extent that an electrical current path 113 does not take the direct path between the first contact structure 105 and the contact hole 123 but rather extends around the slot 112. In this manner, the slot 112 intersects a plurality of potential current paths between the contact hole 123 and the first contact structure. As used in the present description, the term "slot" denotes a region in which the electrically conductive layer 117 is locally removed. For example, in a horizontal plane, the slot may be completely enclosed by the electrically conductive layer 117, as shown in FIG. 4B. The slot may extend in an arcuate or linear shape. According to embodiments, the slot may also extend to the first contact structure 105, for example, as shown in FIG. 4C. For example, a length of the slot may correspond to a multiple of, for example at least ten times or at least a hundred times, a width of the slot. The length and width of the slot are each measured in the horizontal direction. The length of the slot is, for example, the larger horizontal dimension, the width of the slot is, for example, the smaller horizontal dimension.

In this manner, for example, the current path between the first contact structure 105 and the contact holes 123, which are located in the vicinity of the first contact structure 105, is lengthened. Accordingly, the resistance is increased for contact holes 123 which are arranged at a smaller distance from the first contact structure 105, In particular, the slots 112 of those contact holes that are in direct or close proximity to the first contact structure 105 may comprise an extension part 112a that extends from the contact hole 123 in a perpendicular direction away from the contact structure 105. For example, the extension part 112a may extend radially outward, as shown in FIG. 4B. The extension direction of the extension part 112a may correspond to a current flow direction. Those contact holes 123 which are arranged at a medium distance from the first contact structure 105 are, for example, merely provided with a slot 112 without the extension part 112a, and contact holes 123 at an even greater distance from the first contact structure do not include any slot. In this manner, the resistance may be increased as a function of a distance from the first contact structure, as a result of which an increased uniformity of the impressed current density and thus an improved efficiency may be achieved.

FIG. 4C shows part of the optoelectronic semiconductor device according to further embodiments. Here the slots 112 are arranged in a direction approximately perpendicular to the first contact structure 105. For example, the slots 112 extend along a direction of current flow. According to embodiments, portions of the conductive layer 117 that are arranged between a contact hole 123 and the first contact structure 105 are each separated from one another by the slots 112. For example, the slots 112 may extend in a straight line and may each intersect or touch the first contact structure 105. In this case, the conductive layer 117 has been removed in regions which extend parallel to the direction of current flow in the forward direction. Correspondingly, in case of a reverse voltage, a current concentration on individual contact holes 123 is reduced. If, for example, a breakdown occurs locally due to inhomogeneities when a reverse voltage is applied, a current flow is not only concentrated on individual contact holes 123 due to the slots 112. As a result, the ESD resistance of the optoelectronic semiconductor device is increased.

Since only little material of the conductive layer 117 is removed and no current flow lines are intersected, the additional contribution to the voltage in the forward direction (Uf) is low. Accordingly, the presence of these slots 112 may increase the robustness of the optoelectronic component with respect to electrical discharges and thus the ESD stability.

Figure 5A:
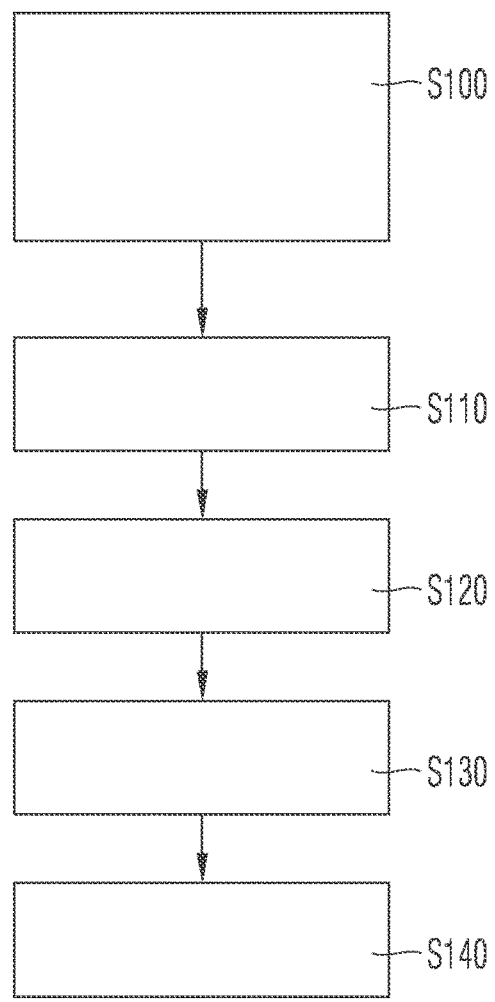
FIG. 5A outlines a method according to embodiments.

FIG. 5A outlines a method according to embodiments. A method for manufacturing an optoelectronic semiconductor device comprises forming (S100) a semiconductor layer stack comprising a first semiconductor layer of a first conductivity type and a second semiconductor layer of a second conductivity type. The method further comprises forming (S110) a contact layer after forming the first semiconductor layer, the contact layer being connected to the first semiconductor layer. The method further comprises forming (S120) a separating layer after forming the contact layer, and forming (S130) contact holes in the separating layer. The method further comprises forming (S140) portions of an electrically conductive layer after forming the separating layer, wherein the portions of the conductive layer are each connected to a conductive material in the contact holes. A first contact structure is electrically connected to the contact layer via the portions of the conductive layer and the conductive material in the contact holes. A length of each of the portions is greater than a greatest width of the portions, the length denoting a shortest distance between an associated contact hole and a conductive material between adjacent portions and the width being measured perpendicular to the length.

For example, the portions 104 of the conductive layer 107 may be manufactured by forming and subsequently patterning a conductive layer. The patterning may be done by an etching process, for example a wet etching process. According to embodiments, for example, a photoresist material may be patterned in a suitable manner. Then, the etching process is carried out using this photo mask. For example, when using a wet etching process, a part of the conductive layer 107 may be underetched.

According to embodiments, a levelling layer 118 may be formed in addition. The same photomask used for etching the conductive layer may be used, for example, to form the levelling layer 118. Subsequently, the material of the levelling layer deposited over the photomask is removed using a lift-off process.

Figure 5B:
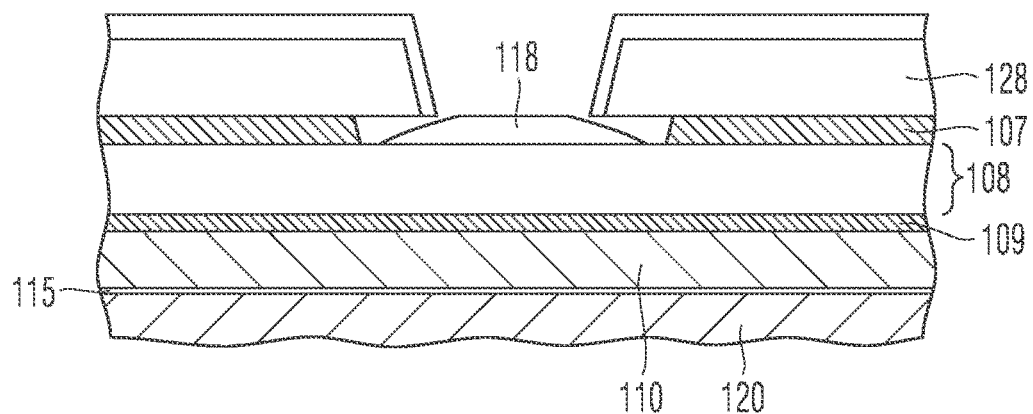
FIG. 5B illustrates a vertical cross-sectional view of a workpiece during performance of a method according to embodiments.

FIG. 5B shows a schematic cross-sectional view to illustrate this method step. A patterned photoresist layer 128 is applied over the portions 104 of the conductive layer 107. When the levelling layer 118 is deposited using the mask that was used to pattern the conductive layer 107, it is ensured that the levelling layer 118 is deposited only in the exposed regions between the portions 104 of the conductive layer 107. After the regions of the compensating layer 118 have been formed, the photoresist mask 128 and the part of the compensating layer deposited over the same are removed again, for example by means of a lift-off process, so that the structure shown in FIG. 3 is finally obtained.

Figure 6:
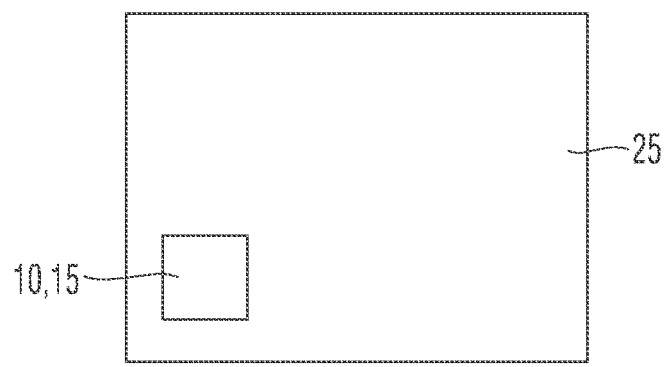
FIG. 6 shows an optoelectronic semiconductor apparatus according to embodiments.

FIG. 6 shows a view of an optoelectronic apparatus 25 according to embodiments. The optoelectronic apparatus 25 comprises the optoelectronic semiconductor device 10 or 15 described herein. For example, the optoelectronic apparatus 25 may be a light-emitting diode.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 optoelectronic semiconductor device
15 optoelectronic semiconductor device
20 emitted electromagnetic radiation
25 optoelectronic apparatus
100 carrier
102 first main surface of the first semiconductor layer
103 passivation layer
104 portion
105 first contact structure
106 first contact element
107 conductive layer
108 separating layer
109 contact layer
110 first semiconductor layer
112 slot
112a extension portion
113 current path
115 active zone
117 electrically conductive layer
118 levelling layer
119 first main surface of the second semiconductor layer
120 second semiconductor layer
121 mesa
122 sidewall of the mesa
123 contact hole
124 conductive material
125 second contact structure
126 second contact element
127 sidewall insulation
128 patterned photoresist layer
129 insulating material
131 first current spreading layer
132 insulating layer
133 portion

The invention claimed is:

1. An optoelectronic semiconductor device comprising:
a first semiconductor layer of a first conductivity type;
a second semiconductor layer of a second conductivity type, the first semiconductor layer and second semiconductor layer being stacked one on top of the other;
a first contact structure;
a contact layer arranged over a side of the first semiconductor layer facing away from the second semiconductor layer and connected to the first semiconductor layer;
a separating layer arranged over a side of the contact layer facing away from the first semiconductor layer;
contact holes arranged in the separating layer; and
portions of a conductive layer arranged over a side of the separating layer facing away from the contact layer, wherein the portions of the conductive layer are each connected to a conductive material in the contact holes,
wherein the first contact structure is connected to the contact layer via the portions of the conductive layer and the conductive material in the contact holes,
wherein a length of each of the portions of the conductive layer is greater than a greatest width of the portions of the conductive layer, wherein the length denotes a shortest distance between an associated contact hole and a second conductive material between adjacent portions of the conductive layer, and wherein the width is measured in the horizontal direction perpendicular to the length,
wherein at least two of the portions of the conductive layer connecting the contact holes to the first contact structure have mutually different widths, wherein the contact holes of the at least two of the portions have different distances from the first contact structure.

2. The optoelectronic semiconductor device according to claim 1, wherein, for a majority of the portions of the conductive layer, each portion of the majority of portions is in direct physical contact with a corresponding one and only one of the contact holes.

3. The optoelectronic semiconductor device according to claim 2, wherein for each portion of the majority of portions, a width of the each portion is selected as a function of a distance between the corresponding one and only one of the contact holes and the first contact structure.

4. The optoelectronic semiconductor device according to claim 1, further comprising parts of an optical levelling layer between adjacent portions of the conductive layer.

5. The optoelectronic semiconductor device according to claim 4, wherein a material of the optical levelling layer is selected from SiON, $Y_2O_3$, $Sc_2O_3$, $HfO_2$, $ZrO_2$, $Ta_2O_5$, $TiO_2$ or $Nb_2O_5$.

6. The optoelectronic semiconductor device according to claim 1, wherein the first contact structure is arranged at a position so as not to overlap the contact holes.

7. The optoelectronic semiconductor device according to claim 1, wherein the first contact structure is formed as a contact finger or comprises a plurality of contact fingers.

8. The optoelectronic semiconductor device according to claim 7, wherein the contact finger is rectangular, ring-shaped or arc-shaped.

9. A method for manufacturing an optoelectronic semiconductor device comprising:
forming a semiconductor layer stack comprising a first semiconductor layer of a first conductivity type and a second semiconductor layer of a second conductivity type;
forming a contact layer after forming the first semiconductor layer, the contact layer being connected to the first semiconductor layer;
forming a separating layer after forming the contact layer;
forming contact holes in the separating layer;
forming portions of a conductive layer after forming the separating layer;
wherein the portions of the conductive layer are each connected to a conductive material in the contact holes;
a first contact structure is connected to the contact layer via the portions of the conductive layer and the conductive material in the contact holes; and
a length of each of the portions of the conductive layer is greater than a greatest width of the portions of the conductive layer, the length denoting a shortest distance between an associated contact hole and a second conductive material between adjacent portions of the conductive layer and the width being measured perpendicular to the length in a horizontal direction; and at least two of the portions of the conductive layer connecting the contact holes to the first contact structure have mutually different widths, wherein the contact holes of the at least two of the portions have different distances from the first contact structure.

10. The method according to claim 9, wherein for a majority of the contact holes, a lead resistance of an associated portion of the conductive layer is adjusted as a function of a distance from the contact hole to the first contact structure.

11. The method according to claim 9, wherein a horizontal width of the portions of the conductive layer is adjusted.

12. The method according to claim 9, wherein forming the portions of the conductive layer comprises forming and subsequently patterning the conductive layer.

13. The method of claim 12, wherein the conductive layer is patterned by etching using a mask; and wherein the method further comprises introducing a levelling layer between regions of the mask after etching.

14. The method according to claim 9, further comprising introducing a levelling layer between the portions of the conductive layer.

15. The method of claim 9, further comprising defining slots in the conductive layer.

16. The method of claim 15, wherein the slots are defined between the contact holes and the first contact structure.

17. A method for manufacturing an optoelectronic semiconductor device comprising:
    forming a semiconductor layer stack comprising a first semiconductor layer of a first conductivity type and a second semiconductor layer of a second conductivity type;
    forming a contact layer after forming the first semiconductor layer, the contact layer being connected to the first semiconductor layer;
    forming a separating layer after forming the contact layer;
    forming contact holes in the separating layer;
    forming portions of a conductive layer after forming the separating layer, wherein the portions of the conductive layer are each connected to a conductive material in the contact holes,
    patterning, subsequent to the forming the portions of the conductive layer, the conductive layer by etching using a mask; and
    introducing, after the patterning by etching, a levelling layer between regions of the mask, wherein:
        a first contact structure is connected to the contact layer via the portions of the conductive layer and the conductive material in the contact holes;
        a length of each of the portions of the conductive layer is greater than a greatest width of the portions of the conductive layer, the length denoting a shortest distance between an associated contact hole and a second conductive material between adjacent portions of the conductive layer and the width being measured perpendicular to the length in a horizontal direction; and
        at least two of the portions of the conductive layer connecting the contact holes to the first contact structure have mutually different widths, wherein the contact holes of the at least two of the portions have different distances from the first contact structure.

* * * * *